United States Patent [19] [11] 4,354,162
Wright [45] Oct. 12, 1982

[54] WIDE DYNAMIC RANGE CONTROL AMPLIFIER WITH OFFSET CORRECTION

[75] Inventor: John W. Wright, Cupertino, Calif.

[73] Assignee: National Semiconductor Corporation, Santa Clara, Calif.

[21] Appl. No.: 232,757

[22] Filed: Feb. 9, 1981

[51] Int. Cl.³ .............................................. H03F 1/34
[52] U.S. Cl. ................................... 330/260; 330/294
[58] Field of Search ............... 330/260, 259, 261, 294, 330/305, 306, 107

[56] References Cited

U.S. PATENT DOCUMENTS 4,292,597 9/1981 Niimura et al. ..................... 330/261

Primary Examiner—James B. Mullins
Assistant Examiner—Gene Wan
Attorney, Agent, or Firm—Gail W. Woodward; James A. Sheridan; Neil B. Schulte

[57] ABSTRACT

A unity gain amplifier circuit has a control characteristic which permits a variation of the high frequency roll off as a function of a control voltage. Means are provided to prevent a change of output voltage resulting from the control voltage variation.

4 Claims, 2 Drawing Figures

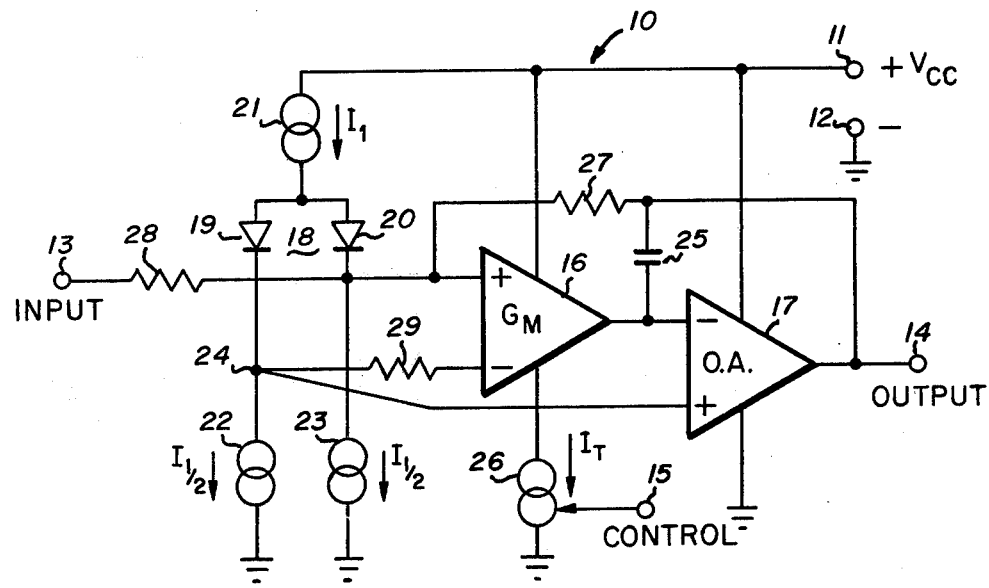
Fig_1
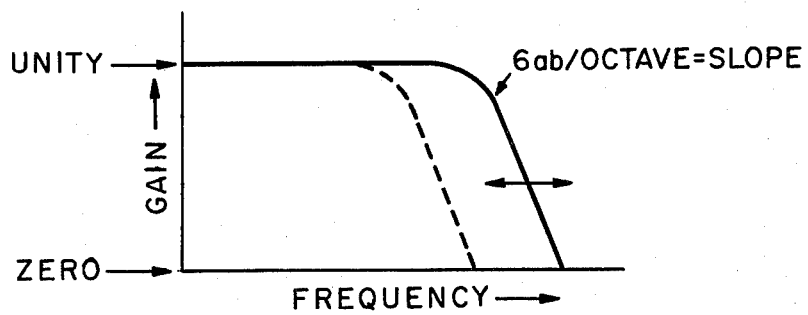
Fig_2

WIDE DYNAMIC RANGE CONTROL AMPLIFIER WITH OFFSET CORRECTION

BACKGROUND OF THE INVENTION

The invention relates to audio amplifiers and in particular to monolithic integrated circuit (IC) audio amplifiers useful in adaptive noise processor systems. Reference is made to a paper by James E. Solomon titled "THE MONOLITHIC OP AMP: A TUTORIAL STUDY" published in the IEEE Journal of Solid-State Circuits Volume SC-9 No. 6 for September, 1974 on pages 314–332. Also, reference is made to my U.S. Pat. No. 4,205,276 which is coauthored with William H. Gross and assigned to the assignee of the present invention. These references deal in detail with some of the elements useful in practicing the present invention. Reference is also made to a paper by Dr. Sergio Franco titled "Use Transconductance Amplifiers" in Electronic Design for Sept. 13, 1976, starting on page 98. This paper describes programmable active filter circuits.

In adaptive audio noise processors it has been found useful to provide a control amplifier that has a wide dynamic range, high linearity, and a frequency response that can be voltage controlled. Basically, the frequency response is used to mask out noise as a function of the audio signal content. Thus, audio noise is effectively processed so as to have a reduced perception to the listener.

It has been found that typical control amplifiers commonly produce an output that is related to its control action and not just the character of the audio content. This undesirable effect can be due to an offset response that is correctable in accordance with the invention.

SUMMARY OF THE INVENTION

It is an object of the invention to reduce the undesired effects of a control amplifier in producing a signal output in response to the control action.

It is a further object of the invention to cancel the offset signal in a control amplifier that appears when the control signal is varied.

These and other objects are achieved in the following manner. A control amplifier is configured from a differential transconductance amplifier driving an integrator created by coupling a capacitor between the output of an operational amplifier and its inverting input. A wide linear dynamic range is achieved by way of a linearizing circuit which includes a pair of forward biased diodes coupled in back to back series configuration across the differential inputs of the differential transconductance amplifier. The inverting input is operated at half of the supply voltage and the noninverting input of the operational amplifier is returned to the same potential. The operational amplifier output is coupled via a feedback resistor to the differential transconductance amplifier noninverting input and an equal value resistor is coupled to the circuit input terminal. The resulting configuration has unity gain and, if the differential transconductance amplifier tail current is varied, the roll off frequency can be varied. The offset shift in output due to tail current control can be avoided by a resistor coupled between the inverting input of the differential transconductance amplifier and the half supply reference point. This resistor is made equal in value to the forward biased diodes series resistance.

BRIEF DESCRIPTION OF THE DRAWING

FIG. 1 of the drawing is a schematic diagram showing the elements of the invention.

FIG. 2 is a graph of frequency versus gain for the circuit of FIG. 1.

DESCRIPTION OF THE INVENTION

The schematic diagram of FIG. 1 shows a control amplifier 10 operated from a $V_{CC}$ power supply coupled between + terminal 11 and ground 12. The circuit has an audio input terminal 13 and an audio output terminal 14. Ideally, a control signal at terminal 15 will control the frequency response of the signal transfer between terminals 13 and 14. With no input at terminal 13 control signal variations at 15 should produce no effect at terminal 14.

The heart of the circuit is a differential transconductance amplifier 16 the output of which drives the inverting input of operational amplifier 17.

A well-known linearizing circuit 18 is employed to give the circuit a wide linear dynamic range. Diodes 19 and 20 are forward biased by current sources 21-23. Source 21 passes $I_1$, while sources 22 and 23 each pass one half of $I_1$. This configuration ensures that node 24 will be at close to $V_{CC}/2$ and can therefore be used as a circuit reference. Diodes 19 and 20 are forward biased and coupled back to back across the differential inputs of amplifier 16.

Operational amplifier 17 has its noninverting input returned to node 24 and it further has capacitor 25 coupled from its output to its inverting input to create an integrator. Thus, differential transconductance amplifier 16 will act to supply signal current to the low impedance integrator input afforded by operational amplifier 17. The current drive capability is set by current source 26 which passes the tail current $I_T$ from the input stage of amplifier 16. The voltage at terminal 15 will control $I_T$ and therefore the frequency roll off of the combined action of the integrator formed with amplifier 17.

A feedback resistor 27 is coupled from the output of amplifier 17 to the noninverting input of amplifier 16 and resistor 28 couples this same input to audio signal input terminal 13. If resistors 27 and 28 are made to have the same value, the maximum gain between terminals 13 and 14 is unity.

FIG. 2 shows the circuit frequency response. The low frequency unity gain is established by resistors 27 and 28. The high frequency 6 db per octave slope is determined by the integrator action produced by amplifier 17 in conjunction with the current drive of amplifier 16. This is simply a low pass filter with a variable frequency cutoff which is determined by the voltage on terminal 15. The dashed line shows a frequency response having a lower cutoff.

In its basic form, if input 13 is shorted to node 24 to simulate no audio input signal, a variation in $I_T$ due to a variable control voltage at terminal 15 should produce no output at terminal 14. However, it has been discovered that as a practical matter, an offset will usually occur. In the absence of resistor 29, when $I_T$ is varied, there is a proportional change in input bias current. Since current sources 21, 22, 23, do not change their value, the on voltage of diodes 19 and 20 cannot change their value. This is due to the action of the feedback loop via resistor 27. The inverting input of the transconductance amplifier gets its input bias current from half supply node 24, and the noninverting input of the transconductance amplifier must get its bias current from resistor 27. Since the noninverting input is a virtual ground and cannot change its voltage, the output node 14 must change its voltage.

Resistor 29 is included in series with the inverting input of transconductance amplifier 16 to cancel the offset. Its value is made equal to the combined resistances of diodes 19 and 20. When $I_T$ is changed, the proportional change in input bias current from the inverting input of the transconductance amplifier flows through resistor 29. This causes a voltage drop which is seen at the noninverting input of the transconductance due to the action of the feedback loop. Diode 20 incrementally turns on as diode 19 incrementally turns off because current sources 21, 22, 23 do not change their value. This voltage difference across diodes 19 and 20 is the exact amount needed to supply a current equal to the input offset current. Since the current does not come from resistor 27, the output voltage does not change.

The action of resistor 29 in eliminating the offset effects is good enough so that as a practical matter the output signal vanishes with the $I_T$ variations normally employed in circuit operation.

EXAMPLE

The circuit of FIG. 1 was fabricated using conventional monolithic IC construction and techniques. Resistors 27 and 28 were each made 20K ohms and resistor 29 was made 750 ohms. Diodes 19 and 20 were made up of conventional NPN transistors with their collectors shorted to their bases. Source 21 was made to pass 140 microamperes while sources 22 and 23 each operated at 70 microamperes $I_T$ was made equal to about 1.5 milliamperes and could be varied down to about 40 microamperes by the action of the control voltage of control terminal 15. The circuit could handle audio signals at the one volt RMS level and displayed a signal to noise ratio in excess of 85 db. Capacitor 25 was made about 0.0047 microfarads and the knee of the current shown in FIG. 2 could be varied over the range of about 800 Hz to about 30 KHz by the action of $I_T$. Under the conditions where terminal 13 was shorted to node 23, the variation of $I_T$ produced an output voltage shift of less than 5 millivolts.

The invention has been described and its performance detailed in an actual example. Clearly, when a person skilled in the art reads the foregoing, alternatives and equivalents will occur to him that are within the spirit and intent of the invention. For example, while monolithic IC Form is preferred, there is no reason why other circuit forms, including discrete parts, could not be used. Accordingly, it is intended that the scope of the invention be limited only by the following claims.

I claim:

1. A control amplifier circuit having a frequency response that can be varied in response to a control voltage, said circuit comprising:
   a variable transconductance amplifier having a differential input;
   means responsive to said control voltage for varying the current in said transconductance amplifier;
   a pair of back to back diodes coupled in series across said differential input;
   means for forward biasing said diodes whereby the linearity of said amplifier is enhanced;
   negative feedback means coupled to the noninverting input of said amplifier to limit the gain thereof; and
   a resistor coupled in series with the inverting input of said amplifier whereby the offset introduced into said amplifier by said means for varying is compensated.

2. The circuit of claim 1, wherein the value of said resistor approximates the resistance of said pair of diodes.

3. The circuit of claim 2, wherein said means for varying comprise a variable tail current source in the input stage of said variable transconductance amplifier.

4. The circuit of claim 3, wherein an integrator is coupled to the output of said transconductance amplifier whereby the frequency response of said amplifier circuit can be varied by controlling said variable tail current.

* * * * *